United States Patent
Ohashi et al.

(10) Patent No.: US 10,236,341 B2
(45) Date of Patent: Mar. 19, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Teruyuki Ohashi, Kawasaki (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/439,232

(22) Filed: Feb. 22, 2017

(65) Prior Publication Data
US 2018/0012956 A1    Jan. 11, 2018

(30) Foreign Application Priority Data
Jul. 6, 2016   (JP) .................. 2016-134056

(51) Int. Cl.
*H01L 29/06*    (2006.01)
*H01L 29/10*    (2006.01)
(Continued)

(52) U.S. Cl.
CPC .......... *H01L 29/063* (2013.01); *H01L 21/049* (2013.01); *H01L 21/0465* (2013.01);
(Continued)

(58) Field of Classification Search
CPC ............... H01L 29/063; H01L 29/1095; H01L 29/7813; H01L 29/1608; H01L 21/0475;
(Continued)

(56) References Cited

U.S. PATENT DOCUMENTS

| 2011/0024831 A1 | 2/2011 | Nakano |
| 2015/0214355 A1 | 7/2015 | Nakano et al. |
| 2017/0012108 A1* | 1/2017 | Sakakibara ......... H01L 21/2033 |

FOREIGN PATENT DOCUMENTS

| JP | 2009-260253 | 11/2009 |
| JP | 2014-38988 | 2/2014 |

OTHER PUBLICATIONS

T.Nakamura et al. "High Performance SiC Trench Devices with Ultra-low Ron," IEEE Electron Devices Society(EDS), 2012, pp. 3.

* cited by examiner

*Primary Examiner* — Caleen O Sullivan
(74) *Attorney, Agent, or Firm* — Oblon, McClelland, Maier & Neustadt, L.L.P.

(57) ABSTRACT

According to one embodiment, a semiconductor device includes first to fourth semiconductor regions, first and second electrodes, and a first insulating film. The first semiconductor region includes first and second partial regions, and an intermediate partial region. The first electrode is separated from the first partial region. The second electrode includes first and second conductive regions. The second semiconductor region is provided between the first conductive region and the first electrode. The third semiconductor region is provided between the first conductive region and at least a portion of the second semiconductor region. The fourth semiconductor region includes third and fourth partial regions. The fourth partial region is positioned between the first conductive region and the first electrode. The first insulating film is provided, between the fourth partial region and the first electrode, and between the second semiconductor region and the first electrode.

19 Claims, 5 Drawing Sheets

(51) Int. Cl.
*H01L 29/16* (2006.01)
*H01L 29/66* (2006.01)
*H01L 29/78* (2006.01)
*H01L 21/04* (2006.01)

(52) U.S. Cl.
CPC ...... *H01L 21/0475* (2013.01); *H01L 29/0696* (2013.01); *H01L 29/1095* (2013.01); *H01L 29/1608* (2013.01); *H01L 29/66068* (2013.01); *H01L 29/7813* (2013.01)

(58) Field of Classification Search
CPC ............... H01L 21/049; H01L 29/0696; H01L 21/0465; H01L 29/66068
USPC .......................................................... 257/77
See application file for complete search history.

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2016-134056, filed on Jul. 6, 2016; the entire contents of which are incorporated herein by reference.

FIELD

Embodiments described herein relate generally to a semiconductor device and a method for manufacturing the same.

BACKGROUND

There is a high breakdown voltage semiconductor device that uses silicon carbide (SIC). It is desirable to reduce the ON resistance of the semiconductor device.

DETAILED DESCRIPTION

According to one embodiment, a semiconductor device includes first to fourth semiconductor regions, first and second electrodes, and a first insulating film. The first semiconductor region includes a first partial region, a second partial region, and an intermediate partial region positioned between the first partial region and the second partial region. The first semiconductor region is of a first conductivity type. The first electrode is separated from the first partial region in a first direction. The first direction crosses a direction from the second partial region toward the first partial region. The second electrode includes a first conductive region separated from the second partial region in the first direction, and a second conductive region separated from the intermediate partial region in the first direction. The second semiconductor region is provided between the intermediate partial region and a portion of the second conductive region in the first direction, is provided between the first conductive region and the first electrode in a second direction, and is electrically connected to the second electrode. The second semiconductor region is of the first conductivity type. The second direction crosses the first direction. The third semiconductor region is provided between the intermediate partial region and another portion of the second conductive region in the first direction, is provided between the first conductive region and at least a portion of the second semiconductor region in the second direction, and is electrically connected to the second electrode. The third semiconductor region is of a second conductivity type. The fourth semiconductor region includes a third partial region and a fourth partial region and is of the second conductivity type. The third partial region is provided between the second partial region and the first conductive region in the first direction. A portion of the intermediate partial region is positioned between the third partial region and the first electrode. The fourth partial region is provided between the intermediate partial region and the second semiconductor region in the first direction and between the intermediate partial region and the third semiconductor region in the first direction. The fourth partial region is positioned between the first conductive region and the first electrode in the second direction. The fourth partial region is continuous with the third partial region. The first insulating film is provided between the first partial region and the first electrode in the first direction, between the fourth partial region and the first electrode in the second direction, and between the second semiconductor region and the first electrode in the second direction.

According to another embodiment, a method for manufacturing a semiconductor device is disclosed. The method can include forming a third semiconductor film of a first conductivity type by introducing a first impurity of the first conductivity type into a portion of an upper portion of a second semiconductor film provided on a first semiconductor film. The first semiconductor film is of the first conductivity type. The second semiconductor film is of a second conductivity type. The method can include forming a fourth semiconductor film by using a first mask to introduce a second impurity of the second conductivity type into another portion of the upper portion of the second semiconductor film exposed from an opening of the first mask. The first mask covers at least a portion of the third semiconductor film. The fourth semiconductor film is of the second conductivity type and includes the second impurity The method can include forming a trench by using a second mask to remove a portion of the second semiconductor film and another portion of the fourth semiconductor film exposed from an opening of the second mask. The second mask covers the portion of the second semiconductor film and a portion of the fourth semiconductor film but not covers another portion of the fourth semiconductor film. The method can include forming a region from a portion of the first semiconductor film positioned under a bottom portion of the trench by introducing a third impurity of the second conductivity type into the bottom portion. The region is of the second conductivity type. In addition, the method can include forming an electrode by introducing a conductive material to an interior of the trench.

Various embodiments will be described hereinafter with reference to the accompanying drawings. The drawings are schematic and conceptual; and the relationships between the, thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In this specification and each drawing, components similar to ones described in reference to an antecedent drawing are marked with the same reference numerals, and a detailed description is omitted as appropriate.

First Embodiment

Figure 1:
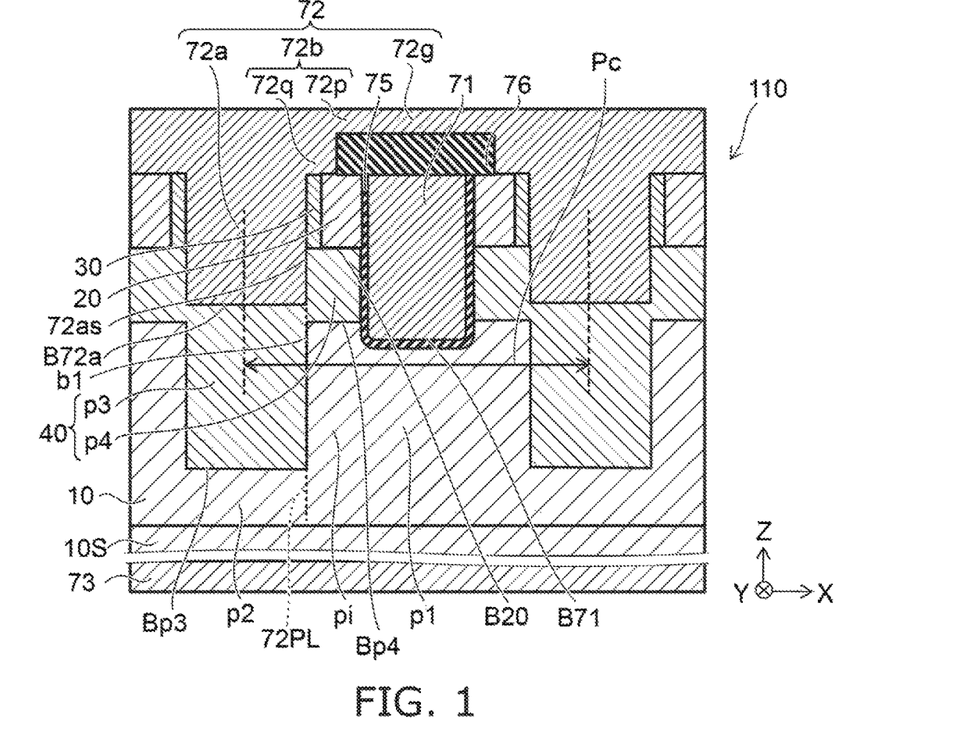
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, the semiconductor device 110 according to the embodiment includes a first semiconductor region 10, a second semiconductor region 20, a third semiconductor region 30, a fourth semiconductor region 40, a first electrode 71, a second electrode 72, and a first insulating film 75. The semiconductor device 110 is, for example, a MOS (Metal-Oxide-Semiconductor) transistor.

For example, the first semiconductor region 10, the second semiconductor region 20, the third semiconductor region 30, and the fourth semiconductor region 40 include silicon carbide (SiC). These semiconductor regions may further include an impurity.

The first semiconductor region 10 includes a first partial region p1, a second partial region p2, and an intermediate partial region pi. The intermediate partial region pi is positioned between the first partial region p1 and the second partial region p2. The boundaries between these partial regions may be indistinct. The first semiconductor region 10 is of a first conductivity type.

The first conductivity type is, for example, an n-type. In such a case, a second conductivity type described below is a p-type. In the embodiment, the first conductivity type may be the p-type; and the second conductivity type may be the n-type. In the examples described below, the first conductivity type is the n-type; and the second conductivity type is the p-type.

For example, the first semiconductor region 10 is an n-layer.

The first electrode 71 is separated from the first partial region p1 in a first direction.

The first direction is taken as a Z-axis directions. One direction perpendicular to the Z-axis direction is taken as an X-axis direction. A direction perpendicular to the Z-axis direction and the X-axis direction is taken as a Y-axis direction.

The first direction (the Z-axis direction) crosses direction from the second partial region p2 toward the first partial region p1.

For example, the first electrode 71 functions as a gate electrode of the semiconductor device 110.

The second electrode 72 includes a first conductive region 72a and a second conductive region 72b. The first conductive region 72a is separated from the second partial region p2 in the first direction (the Z-axis direction). The second conductive region 72b is separated from the intermediate partial region pi in the first direction. The boundaries between these conductive regions may be indistinct. For example, the second electrode 72 functions as a source, electrode of the semiconductor device 110.

The second conductive region 72b of the second electrode 72 may include, for example, a portion 72p and a portion 72q.

In the example, multiple first conductive regions 72a are arranged in the X-axis direction. The first electrode 71 is provided between two first conductive regions 72a. The first conductive region 72a and the first electrode 71 may be arranged alternately. Two most proximal first conductive regions 72a are focused upon in the case where the multiple first conductive regions 72a are arranged along the X-axis direction. The distance between the center in the X-axis direction of one of the two first conductive regions 72a and the center in the X-axis direction of the other of the two first conductive regions 72a corresponds to a cell pitch Pc. Two most proximal first electrodes 71 are focused upon in the case where the multiple first electrodes 71 are arranged along the X-axis direction. The distance between the, center in the X-axis direction of one of the two first electrodes 71 and the center in the X-axis direction of the other of the two first electrodes 71 corresponds to the cell pitch Pc.

The second semiconductor region 20 is provided between the intermediate partial region pi and a portion (the portion 72p) of the second conductive region 72b in the first direction (the Z-axis direction). The second semiconductor region 20 is provided between the first conductive region 72a and the first electrode 71 in the second direction. The second direction is, for example, the X-axis direction. The second semiconductor region 20 is electrically connected to the second electrode 72. The second semiconductor region 20 is of the first conductivity type (in the example, the n-type). The second semiconductor region 20 is, for example, an n$^+$ layer.

The third semiconductor region 30 is provided between the intermediate partial region pi and another portion (the portion 72q) of the second conductive region in the first direction (the Z-axis direction). The third semiconductor region 30 is provided between the first conductive region 72a and at least a portion of the second semiconductor region 20 in the second direction (the X-axis direction). In the example, the entire third semiconductor region 30 is provided between the first conductive region 72a and the second semiconductor region 20 in the second direction (the X-axis direction). The third semiconductor region 30 is electrically connected to the second electrode 72. The third semiconductor region 30 is of the second conductivity type (in the example, the p-type). The third semiconductor region 30 is, for example, a p$^+$-layer.

The fourth semiconductor region 40 includes a third partial region p3 and a fourth partial region p4. The third partial region p3 is provided between the second partial region p2 and the first conductive region 72a in the first direction (the Z-axis direction). A portion of the intermediate partial region pi is positioned between the third partial region p3 and the first electrode 71 in the second direction (the X-axis direction).

The fourth partial region p4 is provided between the intermediate partial region pi and the second semiconductor region 20 in the first direction (the Z-axis direction) and between the intermediate, partial region pi and the third semiconductor region 30 in the first direction. The fourth partial region p4 is positioned between the first conductive region 72a and the first electrode 71 in the second direction (the X-axis direction). At least a portion of the third partial region p3 overlaps the fourth partial region p4 in the second direction. The fourth partial region p4 is continuous with the third partial region p3. The boundary between the third partial region p3 and the fourth partial region p4 may be indistinct. The fourth semiconductor region 40 is of the second conductivity type (in the example, the p-type).

The first insulating film 75 is provided between the first partial region p1 and the first electrode 71 in the first direction (the Z-axis direction), between the fourth partial region p4 and the first electrode 71 in the second direction (the X-axis direction), and between the second semiconductor region 20 and the first electrode 71 in the second direction (the X-axis direction). The first insulating film 75 is provided between the first electrode 71 and a portion of the intermediate partial region pi in the second direction. For example the first insulating film 75 functions as a gate insulating film.

The first insulating film 75 insulates between the first semiconductor region 10 and the first electrode 71. The first insulating film 75 insulates, between the fourth semiconductor region 40 (the fourth partial region p4) and the first electrode 71. The first insulating film 75 insulates between the second semiconductor region 20 and the first electrode 71.

In the example, the semiconductor device 110 further includes a second insulating film 76. At least a portion of the second insulating film 76 is positioned between the first electrode 71 and a portion of the second electrode 72 in the first direction (the Z-axis direction). The second insulating film 76 insulates between the first electrode 71 and the second electrode 72.

In the example, a portion of the second electrode 72 includes a portion (a portion 72g) overlapping the first electrode 71 in the first direction. At least a portion of the second insulating film 76 is provided between the first electrode 71 and the overlapping portion 72g.

A portion of the second insulating film 76 is positioned between the second conductive region 72b and the second semiconductor region 20 in the first direction (the Z-axis direction).

In the example, the semiconductor device 110 further includes a third electrode 73. The third electrode 73 is electrically connected to the first semiconductor region 10. The second partial region p2 of the first semiconductor region 10 is provided between the third electrode 73 and the third partial region p3 in the first direction (the Z-axis direction). The intermediate partial region pi of the first semiconductor region 10 is provided between the third electrode 73 and the fourth partial region p4 in the z-axis direction. The first partial region p1 of the first semiconductor region 10 is provided between the third electrode 73 and the first electrode 71 in the Z-axis direction. For example the third electrode 73 functions as a drain electrode.

In the example, a semiconductor substrate 105 (e.g., a SiC substrate) is provided between the first semiconductor region 10 and the third electrode 73.

As described above, the third semiconductor region 30 (e.g., the $p^+$-layer) is electrically connected to the second electrode 72. The third semiconductor region 30 is a contact region. As described below, the third semiconductor region 30 is formed by a method such as ion implantation, etc. In such a case, many defects may be included in the third semiconductor region 30. When a high electric field is applied to such a third semiconductor region 30, the leakage current becomes large.

In the embodiment, the third semiconductor region 30 is arranged with the second semiconductor region 20 in the X-axis direction. The height (the position in the Z-axis direction) of the third semiconductor region 30 is separated from the height of a bottom portion Bp3 (the lower end) of the third partial region p3 of the fourth semiconductor region 40. Therefore, the electric field that is applied to the third semiconductor region 30 is low.

On the other hand, a first reference example may be considered in which a contact region (a $p^+$-layer) is provided directly under the first conductive region 72a of the second electrode 72. In the first reference example, the contact region (the $p^+$-layer) is provided between the first conductive region 72a of the second electrode 72 and the third partial region p3 of the fourth semiconductor region 40 (the p-layer) in the first direction (the Z-axis direction). In such a first reference example, the distance (the length along the Z-axis direction) between the contact region (the $p^+$-layer) and the bottom portion Bp3 of the third partial region p3 of the fourth semiconductor region 40 is short.

Conversely, in the embodiment, the third semiconductor region 30 (e.g., the $p^+$-layer, i.e., the contact region) is provided at the same height as the second semiconductor region 20. Therefore, the distance between the third semiconductor region 30 and the bottom portion Bp3 of the third partial region p3 of the fourth semiconductor region 40 can be longer than that of the first reference example. Thereby, the electric field that is applied to the third semiconductor region 30 can be lower than that of the first reference example. Thereby, in the embodiment, the leakage current can be suppressed even in the case where many defects are included in the third semiconductor region 30.

In the example of FIG. 1, the first electrode 71 (the gate electrode) is a trench-shaped electrode (an electrode buried in the trench). However, because the internal electric field in SiC is high, for example, the electric field that is applied to the gate insulating film at the bottom portion of the gate electrode is excessively high. Therefore, the characteristics of the insulating film fluctuate. For example, the insulating film degrades (including breakdown). For example, there are cases where the life decreases. Conversely, it is considered that the increase of the electric field at the insulating film of the bottom portion of the gate electrode can be suppressed if the second electrode 72 (the source electrode) also is a trench-shaped electrode and the third partial region p3 is provided. In such a case, if the contact region (the $p^+$-layer) is provided directly under the second electrode 72 (the source electrode) as in the first reference example, the leakage current becomes large as described below. Therefore, it is difficult to obtain a low ON resistance.

In the embodiment, the leakage current can be suppressed as described above. Therefore, the design of a low ON resistance is possible. For example, in the case where the multiple gate electrodes having the trench configurations are used, a low leakage current can be maintained even when the cell pitch Pc is set to be small. Thereby, a low ON resistance is obtained.

Examples of the characteristics of the semiconductor devices will now be described.

Figure 2:
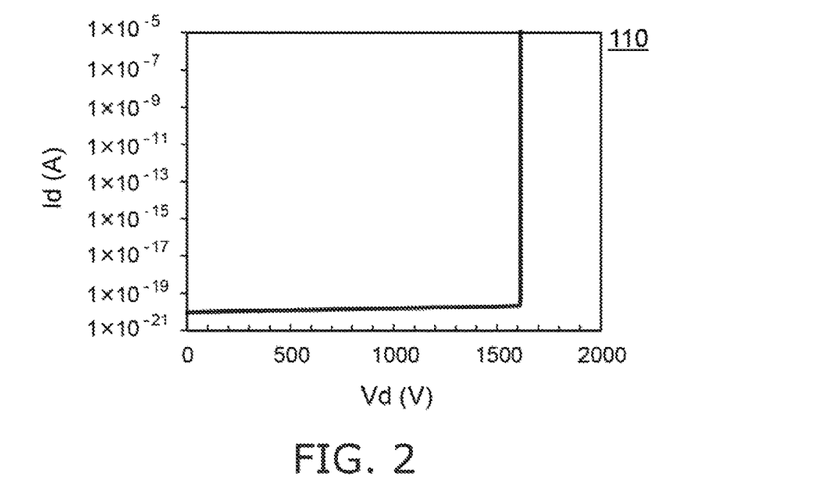
FIG. 2 is a graph illustrating a characteristic of the semiconductor device according to the first embodiment.

FIG. 2 is a graph illustrating a characteristic of the semiconductor device according to the first embodiment.

The horizontal axis of FIG. 2 is a drain voltage Vd (V). The vertical axis is a drain current Id (A). In the semiconductor device 110 according to the embodiment as shown in FIG. 2, the drain current Id is extremely small when the drain voltage Vd is less than the drain voltage Vd where avalanche breakdown occurs (about 1600 V). In other words, a source-drain leak substantially does not occur.

Figure 3:
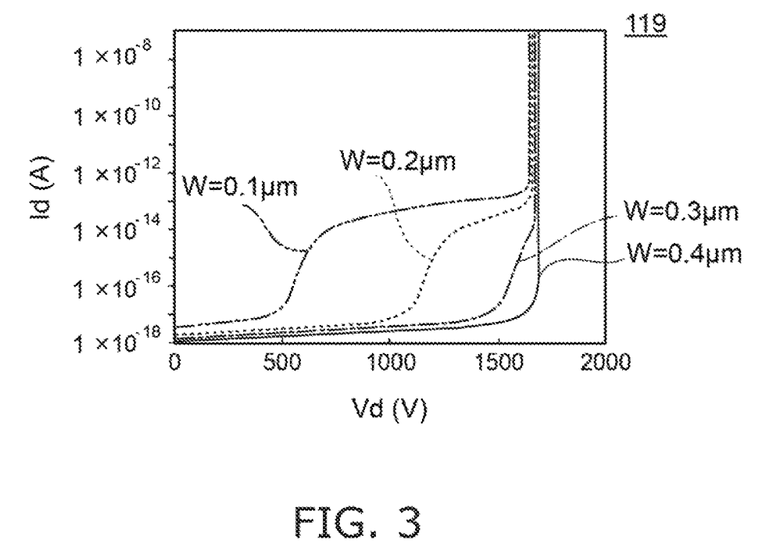
FIG. 3 is a graph illustrating characteristics of the semiconductor device of the first reference example.

FIG. 3 is a graph illustrating characteristics of he semiconductor device of the first reference example.

FIG. 3 illustrates the characteristics of the semiconductor device 119 of the first reference example. In the semiconductor device 119 of the first reference example, the contact region (the p$^+$-layer) is directly under the first conductive region 72a of the source electrode (the second electrode 72). In other words, the contact region (the p$^+$-layer) is provided between a portion of the first conductive region 72a and a portion of the third partial region p3 of the fourth semiconductor region 40. The characteristics of examples having different distances W between the position in the X-axis direction of the end of the contact region (the p$^+$-layer) and the position in the X-axis direction of the third partial region p3 are shown in FIG. 3. In FIG. 3, the distance W is 0.1 μm, 0.2 μm, 0.3 μm, or 0.4 μm. There is a relationship between the distance W and the cell pitch of the semiconductor device 119. The cell pitch becomes large when the distance W is long.

In the semiconductor device 119 of the first reference example as shown in FIG. 3, the drain current Id is large in the low-voltage region when the distance W is short. In other words, the source-drain leak is large. The distance W is set to be long to reduce the source-drain leak. This causes the ON resistance to increase.

Figure 4:
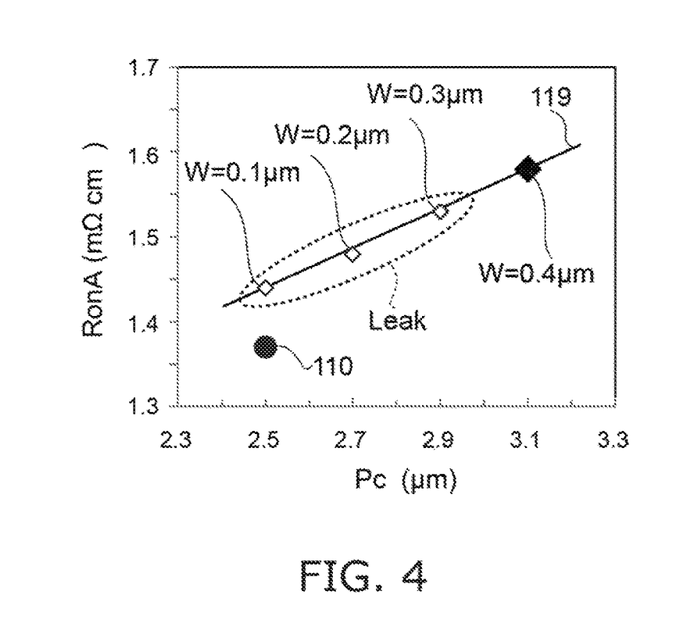
FIG. 4 is a graph illustrating the characteristics of the semiconductor devices.

FIG. 4 is a graph illustrating the characteristics of the semiconductor devices.

In FIG. 4, the horizontal axis is the cell pitch Pc (μm) (referring to FIG. 1). The vertical axis is an ON resistance RonA (Ω·cm$^2$). The characteristic of the semiconductor device 110 according to the embodiment and the characteristics of the semiconductor device 119 of the first reference example are shown in FIG. 4. In the first reference example, the cell pitch Pc is interrelated with the distance W described above.

In the semiconductor device 119 of the first reference example as shown in FIG. 4, a low ON resistance RonA is obtained by setting the cell pitch Pc to be small. However, leaks occur in the case where the cell pitch Pc is small (the case where the distance W is 0.1 μm to 0.3 μm). Accordingly, in the configuration of the first reference example, the ON resistance RonA is large in the practical case where the leak is small.

Conversely, in the semiconductor device 110 according to the embodiment, the leakage current is small as illustrated in FIG. 2. The leakage current substantially does not occur even when the cell pitch Pc is small. As shown in FIG. 4, a low ON resistance RonA is obtained in a state in which the leakage current substantially does not occur.

Thus, according to the embodiment, a semiconductor device can be provided in which the ON resistance can be reduced.

In the semiconductor device 110, at least a portion of the third semiconductor region 30 overlaps the second semiconductor region 20 in the X-axis direction. For example, the position in the Z-axis direction of the third semiconductor region 30 is the same as the position in the Z-axis direction of the second semiconductor region 20. For example, the side surface (the surface crossing the X-axis direction) of the second semiconductor region 20 contacts the third semiconductor region 30.

For example, a second reference example may be considered in which the third semiconductor region 30 is provided lower than the second semiconductor region 20 in the Z-axis direction. In the second reference example, the side surface and the upper surface of the second semiconductor region 20 contact the second electrode 72. Therefore, in the second reference example, the resistance (the contact resistance) between the second semiconductor region 20 and the second electrode 72 can be low. However, in such a second reference example, the height of the third semiconductor region 30 is lower than that of the configuration according to the embodiment. Therefore, the leakage current easily becomes large.

Generally, the reduction of the contact resistance is regarded as important. Therefore, even when considering providing the contact region (the p$^+$-layer) at a position not directly under the first conductive region 72a, the configuration having the contact region (the p$^+$-layer) arranged with the second semiconductor region 20 in the x-axis direction is not readily apparent.

Conversely, in the embodiment, the contact region (the third semiconductor region 30) is arranged with the second semiconductor region 20 in the X-axis direction. Even in the case where the resistance (the contact resistance) between the second semiconductor region 20 and the second electrode 72 is high compared to that of the second reference example, a large effect of suppressing the electric field of the third semiconductor region 30 to be low is obtained by setting the third semiconductor region 30 to be distal to the bottom portion of the first conductive region 72a. In the configuration of the embodiment, it is practically difficult for the increase of the resistance (the contact resistance) between the second semiconductor region 20 and the second electrode 72 to become a problem.

In the embodiment as illustrated in FIG. 1, a bottom portion 872a (the bottom portion, i.e., the lower end, of the source trench) of the first conductive region 72a is lower than a bottom portion 820 (the lower end) of the second semiconductor region 20. For example, a bottom portion Bp4 (the lower end) of the fourth partial region p4 is lower than the bottom portion B72a of the first conductive region 72a For example, a bottom portion 871 (the bottom portion, i.e., the lower end of the gate trench) of the first electrode 71 is lower than the bottom portion Bp4 of the fourth partial region p4. For example, the bottom portion Bp3 of the third partial region p3 is lower than the bottom portion 871 of the first electrode 71. For example, the concentration of the electric field at the insulating film of the lower portion of the gate electrode can be suppressed; and a high breakdown voltage is obtained. For example, the breakdown of the insulating film can be suppressed.

For example, the position in the Z-axis direction of the bottom portion B72a of the first conductive region 72a is between the position in the Z-axis direction of the bottom portion B20 of the second semiconductor region 20 and the position in the Z-axis direction of the bottom portion Bp4 of the fourth partial region p4. The position in the Z-axis direction of the bottom portion Bp4 of the fourth partial region p4 is between the position in the Z-axis direction of the bottom portion B72a of the first conductive region 72a and the position in the Z-axis direction of the bottom portion B71 of the first electrode 71. The position in the Z-axis direction of the bottom portion B71 of the first electrode 71 is between the, position in the Z-axis direction of the bottom portion Bp4 of the fourth partial region p4 and the position in the Z-axis direction of the bottom portion Bp3 of the third partial region p3.

In the embodiment, the length (the width) along the X-axis direction of the third semiconductor region 30 is, for example, not less than 0.04 times and not more than 1.3 times the length (the width) along the X-axis direction of the first conductive region 72a. The length (the width) along the X-axis direction of the third semiconductor region 30 is, for example, not less than 0.04 times and not more than 2 times the length (the width) along the X-axis direction of the second semiconductor region 20.

The length in the Z-axis direction of the third semiconductor region 30 is, for example, not less than 0.03 times and not more than 2 times the length in the Z-axis direction of the first electrode 71. The length in the Z-axis direction of the third semiconductor region 30 is, for example, not less than 0.1 times and not more than 10 times the length in the Z-axis direction of the second semiconductor region 20.

For example, the length (the width) along the X-axis direction of the third semiconductor region 30 may be shorter than the length in the Z-axis direction of the third semiconductor region 30.

In the semiconductor device 110 according to the embodiment, for example, at least one of nitrogen (N), phosphorus (P), or arsenic (As) is used as the n-type impurity. In the embodiment, for example, at least one of aluminum (Al) or boron (B) is used as the p-type impurity.

For example, at least one of the first semiconductor region 10 or the second semiconductor region 20 includes at least one of N, P, or As. At least one of the third semiconductor region 30 or the fourth semiconductor region 40 includes at least one of Al or B.

For example, the concentration of the impurity (described above) in the second semiconductor region 20 is higher than the concentration of the impurity in the first semiconductor region 10. The concentration of the impurity (described above) in the third semiconductor region 30 is higher than the concentration of the impurity in the fourth semiconductor region 40.

For example, the p-type impurity concentration (the carrier concentration) in the fourth partial region p4 (the upper portion) in the fourth semiconductor region 40 is lower than the p-type impurity concentration (the carrier concentration) in the third partial region p3 (the lower portion). By setting the p-type impurity concentration (the carrier concentration) in the fourth partial region p4 to be low, for example, it is easy to adjust the threshold voltage appropriately. By setting the p-type impurity concentration (the carrier concentration) in the third partial region p3 to be high, for example, the electric field applied to the first insulating film 75 (the gate insulating film) at the bottom portion of the first electrode 71 can be set to be low. By setting the p-type impurity concentration (the carrier concentration) in the third partial region p3 to be high, for example, the electric field applied to the third semiconductor region 30 can be set to be low.

The concentration of the n-type impurity in the first semiconductor region 10 is, for example, not less than $1 \times 10^{14}$ cm$^{-3}$ and not more than $5.10^{17}$ cm$^{-3}$. The concentration of the n-type impurity in the second semiconductor region 20 is, for example, not less than $5 \times 10^{18}$ cm$^{-3}$ and not more than $1 \times 10^{20}$ cm$^{-3}$. The concentration of the p-type impurity in the third semiconductor region 30 is, for example, not less than $5 \times 10^{18}$ cm$^{-3}$ and not more than $1 \times 10^{20}$ cm$^{-3}$. The concentration of the p-type impurity in the third partial region p3 of the fourth semiconductor region 40 is, for example, not less than $1 \times 10^{16}$ cm$^{-3}$ and not more than $1 \times 10^{19}$ cm$^{-3}$. The concentration of the p-type impurity in the fourth partial region p4 of the fourth semiconductor region 40 is, for example, not less than $5 \times 10^{15}$ cm$^{-3}$ and not more than $1 \times 10^{18}$ cm$^{-3}$. For example, in the case where the concentration of the p-type impurity in the third partial region p3 is not less than $7 \times 10^{17}$ cm$^{-3}$ and not more than $1 \times 10^{19}$ cm$^{-3}$, the concentration of the p-type impurity in the fourth partial region p4 is, for example, not less than $1 \times 10^{16}$ cm$^{-3}$ but less than $7 \times 10^{17}$ cm$^{-3}$. For example, the impurity concentration is detected by SIMS (Secondary Ion Mass Spectrometry), etc.

For example, the carrier concentration in the second semiconductor region 20 is higher than the carrier concentration in the first semiconductor region 10 The carrier concentration in the third semiconductor region 30 is higher than the carrier concentration in the fourth semiconductor region 40.

The carrier concentration in the first semiconductor region 10 is, for example, not less than $1 \times 10^{14}$ cm$^{-3}$ and not more than $5 \times 10^{17}$ cm$^{-3}$. The carrier concentration in the second semiconductor region 20 is, for example, not less than $5 \times 10^{18}$ cm$^{-3}$ and not more than $1 \times 10^{20}$ cm$^{-3}$. The carrier concentration in the third semiconductor region 30 is, for example, not less than $5 \times 10$ cm$^{-3}$ and not more than $1 \times 10^{20}$ cm$^{-3}$. The carrier concentration in the third partial region p3 of the fourth semiconductor region 40 is, for example, not less than $1 \times 10^{16}$ cm$^{-3}$ and not more than $1 \times 10^{19}$ cm$^{-3}$. The carrier concentration in the fourth partial region p4 of the fourth semiconductor region 40 is, for example, not less than $5 \times 10^{15}$ cm$^{-3}$ and not more than $1 \times 10^{18}$ cm$^{-3}$. For example, in the case where the carrier concentration in the third partial region p3 is not less than $7 \times 10^{17}$ cm$^{-3}$ and not more than $1 \times 10^{19}$ cm$^{-3}$, the carrier concentration in the fourth partial region 4 is not less than $1 \times 10^{16}$ cm$^{-3}$ but less than $7 \times 10^{17}$ cm$^{-3}$. For example, the carrier concentration is detected by a SCM (Scanning Capacitance Microscope), etc.

In the embodiment, the first electrode 71 includes, for example, polysilicon. The first electrode 71 may include, for example, at least one of TiN, Al, Ru, W, or TaSiN.

At least one of the second electrode 72 or the third electrode 73 may include at least one of Al or Ni. These electrodes may include, for example, a stacked film including an Al film and a Ni film.

At least one of the first insulating film 75 or the second insulating film 76 includes, for example, at least one of silicon oxide, silicon nitride, silicon oxynitride, aluminum oxide, lanthanum oxide, or tantalum oxide.

For example, the second electrode 72 may include, for example, at least one of metal silicide or metal carbide. The second insulating film 76 may include a metal silicide including the metal included in the second electrode 72. The second insulating film 76 may include a metal carbide including the, metal included in the second electrode 72. An intermediate region that includes at least one of a metal silicide or a metal carbide may be provided between the second electrode 72 and the second insulating film 76. At least one of the metal silicide or the metal carbide of the intermediate region includes the metallic element included in the second electrode 72.

In the embodiment as shown in FIG. 1, for example, the third semiconductor region 30 contacts the first conductive region 72a. The second semiconductor region 20 contacts the second conductive region 72b.

An example of a method for manufacturing the semiconductor device 110 according to the embodiment will now be described.

FIG. 5A to FIG. 5F are schematic cross-sectional views in order of the processes, illustrating the method for manufacturing the semiconductor device according to the first embodiment.

Figure 5A:
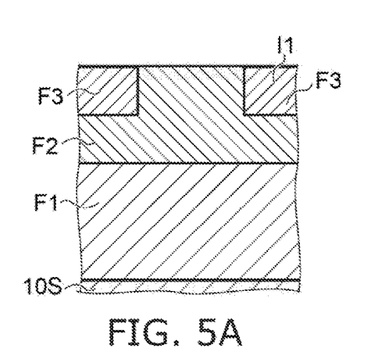
FIG. 5A to FIG. 5F are schematic cross-sectional views in order of the processes, illustrating the method for manufacturing the semiconductor device according to the first embodiment.

As shown in FIG. 5A, a first semiconductor film F1 of the first conductivity type (e.g., the n-type) is formed on the semiconductor substrate 10S. For example, the first semiconductor film F1 is obtained by epitaxial growth. A second semiconductor film F2 of the second conductivity type (e.g., the p-type) is formed on the first semiconductor film F1. For example, the second semiconductor film F2 is obtained by implanting an impurity of the second conductivity type into the upper portion of the first semiconductor film F1. An impurity (a first impurity I1, i.e., an n-type impurity) of the first conductivity type is implanted into a portion of the upper portion of the second semiconductor film F2. Thereby, a third semiconductor film F3 of the first conductivity type is obtained.

The first semiconductor film F1 is used to form the first semiconductor region 10. The second semiconductor film F2 is used to form a portion of the fourth semiconductor region 40. The third semiconductor film F3 is used to form the second semiconductor region 20.

Subsequently, a trench is formed in a not-illustrated region; and the first insulating film 75 and the first electrode 71 are formed in the interior of the trench. Subsequently, the second insulating film 76 is formed.

Figure 5B:
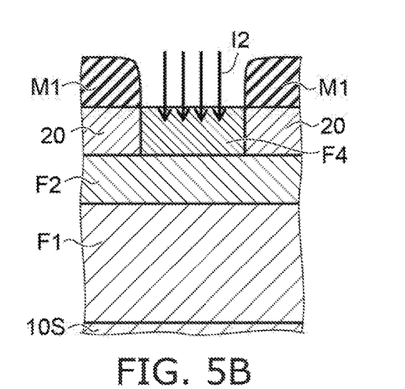

As shown in FIG. 5B, a first mask M1 is formed on the third semiconductor film F3 (the second semiconductor region 20). The first mask M1 covers at least a portion of the third semiconductor film F3 (the second semiconductor region 20). Another portion of the upper portion of the second semiconductor film F2 is exposed from the opening of the first mask M1. A second impurity I2 of the second conductivity type (the p-type) is implanted into the exposed other portion of the upper portion of the second semiconductor film F2 by using the first mask M1 as a mask. Thereby, a fourth semiconductor film F4 is formed. The fourth semiconductor film F4 includes the second impurity I2 and is of the second conductivity type.

Figure 5C:
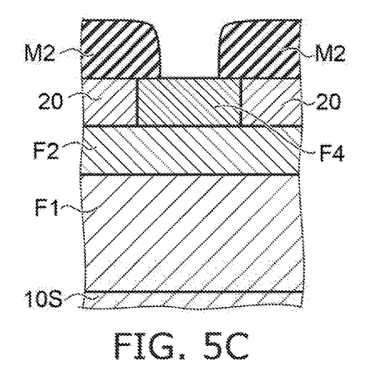

A second mask M2 is formed as shown in FIG. 5C. The second mask M2 covers the portion of the second semiconductor film F2 described above (the portion covered with the first mask M1) and a portion of the fourth semiconductor film F4 (a portion where the second impurity I2 is implanted). The second mask M2 does not, cover another portion of the fourth semiconductor film F4. The other portion of the fourth semiconductor film F4 is exposed from the opening of the second mask M2. For example, the second mask M2 is formed by elongating the first mask M1. For example, the second mask M2 may be formed by forming a film of a prescribed thickness on the first mask M1. The width of the opening of the second mask M2 is narrower than the width of the opening of the first mask M1. The second mask M2 is provided on the second semiconductor film F2 and on a portion of the region where the second impurity I2 is implanted. Another portion of the region where the second impurity I2 is implanted is not covered with the second mask M2.

Figure 5D:
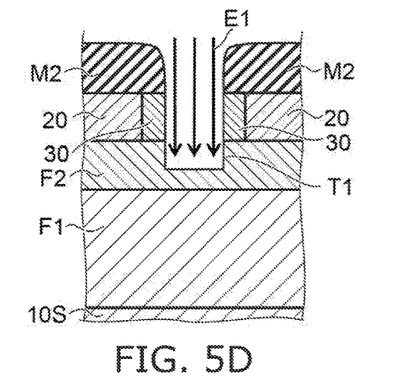

As shown in FIG. 5D, a trench T1 (a source trench) is formed using the second mask M2 as a mask. Namely, a portion of the second semiconductor film F2 and the other portion of the fourth semiconductor film F4 described above exposed from the opening of the second mask M2 are removed.

Thereby, the trench T1 is formed. For example, RIE (Reactive Ion Etching) or the like is implemented. The trench T1 pierces a portion of the region where the second impurity I2 is implanted and reaches a portion of the second semiconductor film F2. The bottom portion of the trench T1 is between the upper end and the lower end of the second semiconductor film F. The remaining portion of the region where the second impurity I2 is implanted is used to form the third semiconductor region 30.

Figure 5E:
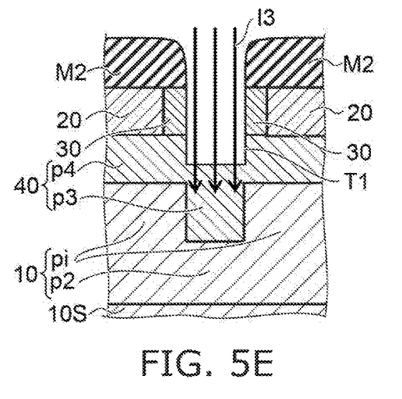

As shown in FIG. 5E, a third impurity I3 of the second conductivity type (the p-type) is introduced to the bottom portion of the trench T1. A region of the second conductivity type is formed from a portion of the first semiconductor film F1 positioned under the bottom portion of the trench T1. The region of the second conductivity type is used to form the third partial region p3 of the fourth semiconductor region 40. The second semiconductor film F2 is used to form the fourth partial region p4 of the fourth semiconductor region 40. For example, the third impurity I3 of the p-type is implanted using the second mask M2 as a mask. The third impurity I3 is implanted into the portion of the first semiconductor film F1.

The introduction (the implantation) of the third impurity into the bottom portion of the trench T1 is an implantation aligned with the side wall of the trench T1. In other words, perpendicular implantation is performed, rather than a tilted implantation in which the implantation direction is tilted from the side wall of the trench. For example, the angle (the absolute value of the angle) between the direction of the implantation of the third impurity I3 and the side wall of the trench T1 is 5 degrees or less.

The second mask M2 is removed as shown in FIG. 5D. Subsequently, a conductive material is filled into the interior of the trench T1. Thereby, the second electrode 72 is formed.

In the semiconductor device 110 that is manufactured by such a method, the third impurity I3 is implanted perpendicularly. In other words, oblique implantation is not performed. Therefore, the region where the impurity is implanted can be controlled with high precision. For example, the third semiconductor region 30 is formed by the trench T1. The third partial region p3 of the fourth semiconductor region 40 is further formed by the trench T1. The third semiconductor region 30, the third partial region p3, and the first conductive region 72a are formed based on the trench T1. These portions are formed by self-alignment. Therefore, the precision of the relative positional relationship between the third semiconductor region 30 and the third partial region p3 is high. Thereby, the fluctuation of the characteristics can be suppressed.

For example, in the case where the impurity is implanted by oblique implantation, the third impurity I3 is implanted from multiple directions. Therefore, the number of processes is high. Conversely, according to the method recited above, the process is simple because perpendicular implantation is implemented.

By such a manufacturing method, a semiconductor device in which the ON resistance can be reduced can be manufactured easily with high precision.

In the case where the semiconductor device 110 is manufactured by the manufacturing method recited above, it is easy to, position the side surface of the third partial region p3 substantially on an extension of the side surface of the first conductive region 72a. As shown in FIG. 1, the first conductive region 72a has a side surface 72as. The side surface 72as crosses the second direction (the X-axis direction). A boundary between the third partial region p3 and the intermediate partial region pi is aligned with a plane 72PL including the side surface 72as. In the example, the boundary b1 is on an extension of the side surface 72as. For example, the boundary b1 is positioned in the plane 72PL. There may be a case where the implanted third impurity I3 (referring to FIG. 5E) diffuses. In such a case, as described below, there are cases where the boundary b1 is separated from the plane 72PL.

In the embodiment, the boundary b1 between the third partial region p3 and the intermediate partial region pi may be defined as follows. For example, the third partial region p3 includes an impurity of the second conductivity type (e.g., the p-type). The position where the value of the concentration of the impurity of the second conductivity type of the third partial region p3 is ½ of the maximum value is taken as the boundary b1.

As recited above, the third semiconductor region 30 is formed by ion implantation. For example, the density of defects in the third semiconductor region 30 is, for example, higher than the density of defects in the fourth partial region p4 of the fourth semiconductor region 40. The density of defects in the third semiconductor region 30 is, for example, higher than the density of defects in the first semiconductor, region 10.

For example, in the spectrum of the photoluminescence of the third semiconductor region 30, the maximum value of the intensity of the photoluminescence in the range of wavelengths not less than 480 nm and not more than 500 nm is higher than the maximum value of the intensity of the photoluminescence in the range of wavelengths not less than 370 nm and not more than 400 nm.

On the other hand, in the spectrum of the photoluminescence of the fourth semiconductor region 40, the, maximum value of the intensity of the photoluminescence in the range of wavelengths not less than 480 nm and not more than 500 nm is lower than the maximum value of the intensity of the photoluminescence in the range of wavelengths not less than 370 nm and not more than 400 nm.

For example, the ratio (a first ratio) of the maximum value of the intensity of the photoluminescence of the third semiconductor region 30 in a range of wavelengths not less than 480 nm and not more than 500 nm to the maximum value of the intensity of the photoluminescence of the third semiconductor region 30 in a range of wavelengths not less, than 370 nm and not more than 400 nm is high. For example, the ratio (a second ratio) of the maximum value of the intensity of the photoluminescence of the fourth semiconductor region 40 in a range of wavelengths not less than 480 nm and not more than 500 nm to the maximum value of the intensity of the photoluminescence of the fourth semiconductor region 40 in a range of wavelengths not less than 370 nm and not more than 400 nm is low. For example, the first ratio is higher than the second ratio.

It is considered that such a difference of the spectra of the photoluminescence is caused by the density of defects in the third semiconductor region 30 being high. In the embodiment, when providing the third semiconductor region 30 having such a spectrum, the third semiconductor region 30 is provided to be positioned to overlap the second semiconductor region 20 in the second direction (the X-axis direction). Thereby, the leakage current can be suppressed; and a low ON resistance is obtained.

Figure 6:
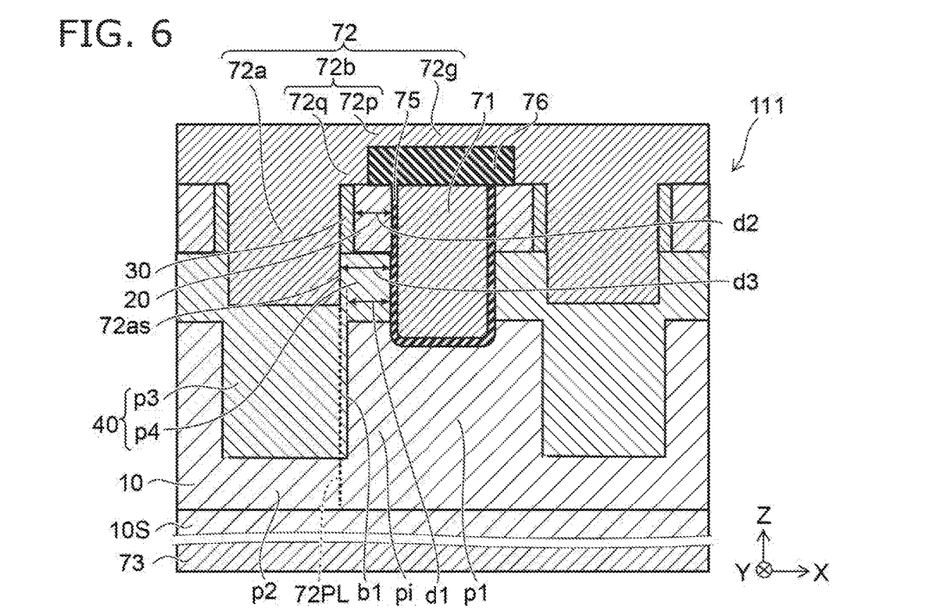
FIG. 6 is a schematic cross-sectional view illustrating another semiconductor device according to the first embodiment.

FIG. 6 is a schematic cross-sectional view illustrating another semiconductor device according to the, first embodiment.

As shown in FIG. 6, the first to fourth semiconductor regions 10, 20, 30, and 40, the first electrode 71, the second electrode 72, and the first insulating film 75 are provided in the other semiconductor device 111 according to the embodiment as well. In the semiconductor device 111 as well, the boundary b1 between the third partial region p3 and the intermediate partial region pi is aligned with the plane 72PL including the side surface 72as (a surface crossing the second direction) of the first conductive region 72a of the, second electrode 72. In the semiconductor device 111 as well, the boundary is separated from the plane 72PL. Otherwise, the semiconductor device 111 is similar to the semiconductor device 110.

For example, the configuration of the semiconductor device 111 recited above is formed when the implanted third impurity I3 (referring to FIG. 5E) diffuses.

In the semiconductor device 111 as well, perpendicular implantation of the third impurity I3 is performed rather than oblique implantation. Therefore, the position of the boundary b1 is proximal to the plane 72PL.

For example, a first distance d1 is the distance along the second direction (the X-axis direction) between the first insulating film 75 and the boundary b1 between the third partial region p3 and the intermediate partial region pi. A second distance d2 is the distance along the second direction (the X-axis direction) between the first insulating film 75 and a boundary b2 between the second semiconductor region 20 and the third semiconductor region 30. For example, the first distance d1 is longer than the second distance d2.

For example, a third distance d3 is the distance along the second direction between the first conductive region 72a and the first insulating film 75. The first distance d1 (the distance along the second direction between the first insulating film 75 and the boundary b1 between the third partial region p3 and the intermediate partial region pi) is shorter than the third distance d3.

In the embodiment, the boundary b2 between the second semiconductor region 20 and the third semiconductor region 30 may be defined as follows. For example, the third semiconductor region 30 includes an impurity of the second conductivity type (e.g., the p-type). The position where the value of the concentration of the impurity of the second conductivity type of the third semiconductor region 30 is ½ of the maximum value is taken as the boundary b2.

In the semiconductor device 111 as well, the leakage current can be suppressed. In the semiconductor device 111 as well, a low ON resistance is obtained.

Figure 7:
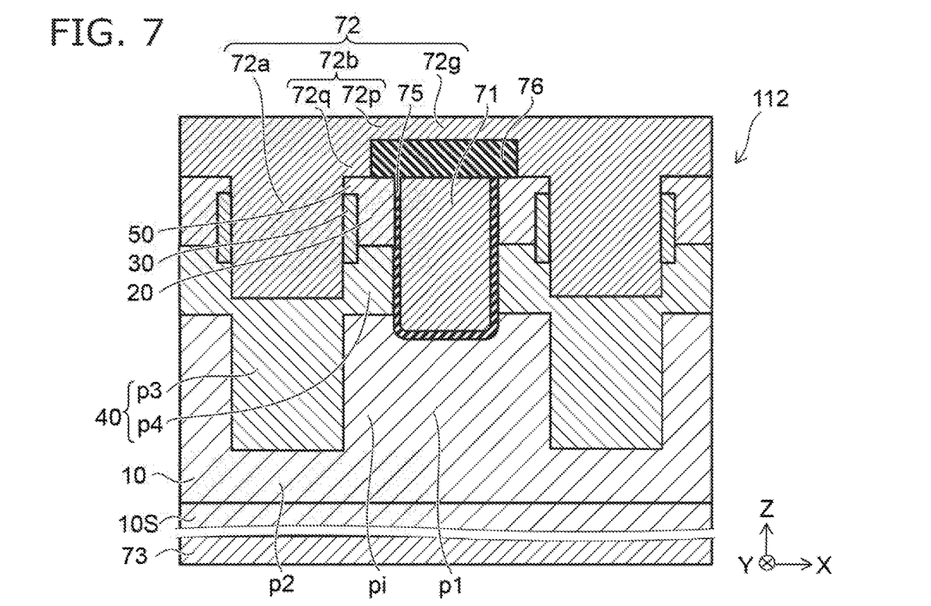
FIG. 7 is a schematic cross-sectional view illustrating another semiconductor device according to the first embodiment.

FIG. 7 is a schematic cross-sectional view illustrating another semiconductor device according to the first embodiment.

In the other semiconductor device 112 according to the embodiment as shown in FIG. 7, a portion of the third semiconductor region 30 is provided between the first conductive region 72a and a portion of the second semiconductor region 20 in the second direction (the X-axis direction). Otherwise, the semiconductor device 112 is similar to the semiconductor device 110.

In the semiconductor device 112, a portion of the second semiconductor region 20 is between the third semiconductor region 30 and the second conductive region 72b of the second electrode 72 in the first direction (the Z-axis direction). In the semiconductor device 112, the surface area of the region where the second semiconductor region 20 and the second conductive region 72b contact is wide. A portion of the side surface of the second semiconductor region 20 contacts the first conductive region 72a. A low contact resistance is obtained.

In the semiconductor device 112 as well, the leakage current can be suppressed. In the semiconductor device 112 as well, a low ON resistance is obtained.

Figure 8:
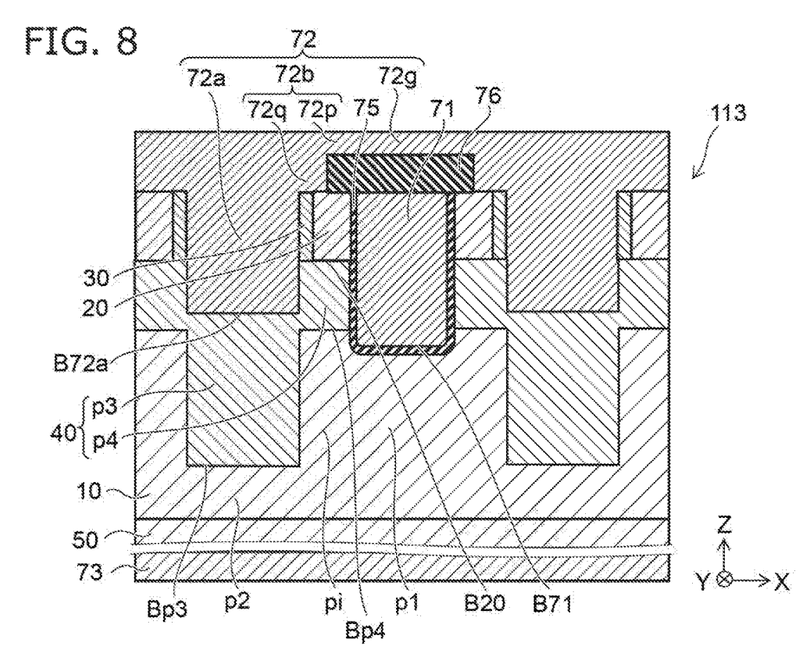
FIG. 8 is a schematic cross-sectional view illustrating another semiconductor device according to the first embodiment.

FIG. 8 is a schematic cross-sectional view illustrating another semiconductor device according to the first embodiment.

As shown in FIG. 8, the other semiconductor device 113 according to the embodiment further includes the fifth semiconductor region 50 in addition to the first to fourth semiconductor regions 10, 20, 30, and 40. Otherwise, the semiconductor device 113 is similar to the semiconductor device 110.

The fifth semiconductor region 50 is of the second conductivity type (in the example, the p-type). In the first direction (the Z-axis direction), the first semiconductor region 10 is provided between the fifth semiconductor region 50 and the fourth semiconductor region 40 and between the fifth semiconductor region 50 and the first electrode 71.

The semiconductor device 113 is, for example, an IGBT (Insulated Gate Bipolar Transistor). In the semiconductor device 113 as well, the leakage current can be suppressed. In the semiconductor device 113 as well, the ON resistance can be reduced.

Similarly to the semiconductor device 111, the boundary b1 may be separated from the plane 72PL in the semiconductor device 113.

Similarly to the semiconductor device 112, a portion of the second semiconductor region 20 may be provided between the third semiconductor region 30 and the second conductive region 72b of the second electrode 72 in the semiconductor device 113.

Second Embodiment

The embodiment relates to a method for manufacturing the semiconductor device.

Figure 9:
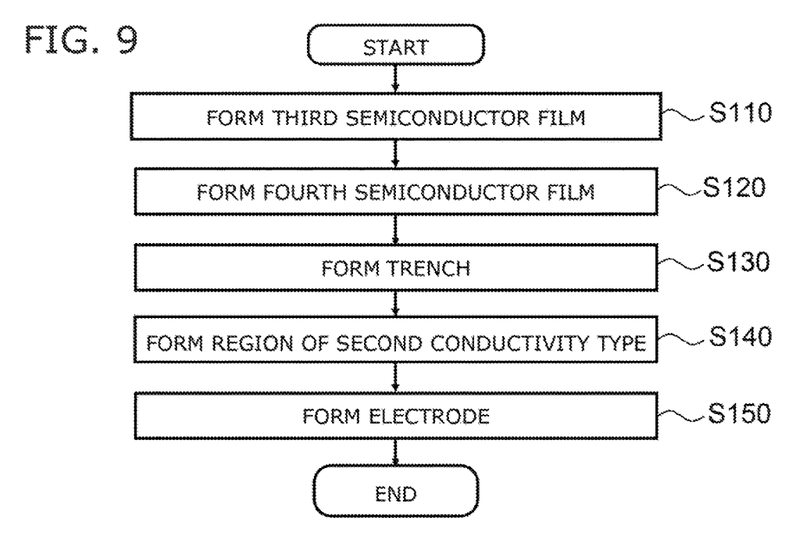
FIG. 9 is a flowchart illustrating the method for manufacturing the semiconductor device according to the second embodiment.

FIG. 9 is a flowchart illustrating the method for manufacturing the semiconductor device according to the second embodiment.

In the method for manufacturing the semiconductor device according to the embodiment as shown in FIG. 9, the third semiconductor film F3 of the first conductivity type is formed by introducing the first impurity I1 of the first conductivity type into a portion of the upper portion of the second semiconductor film F2 of the second conductivity type provided on the first semiconductor film F1 of the first conductivity type (step S110). For example, the processing illustrated in FIG. 5A is performed.

The fourth semiconductor film F4 of the second conductivity type including the second impurity is formed by introducing the second impurity I2 of the second conductivity type into another portion of the upper portion of the second semiconductor film F2 exposed from the opening of the first mask M1 by using the first mask M1 covering at least a portion of the third semiconductor film F3 (step S120). For example, the processing illustrated in FIG. 5B is performed.

The trench T1 is formed by removing a portion of the second semiconductor film F2 and the other portion of the fourth semiconductor film F4 described above exposed from the opening of the second mask M2 by using the second mask M2 to cover the portion of the, second semiconductor film F2 described above and a portion of the fourth semiconductor film F4 but not cover the other portion of the fourth semiconductor film F4 (step S130). For example, the processing illustrated in FIG. 5C and FIG. 5D is performed.

A region of the second conductivity type is formed from a portion of the first semiconductor film F1 positioned under the bottom portion by introducing the third impurity I3 of the second conductivity type into the bottom portion of the trench T1 (step S140). For example, the processing illustrated in FIG. 5E is performed. For example, the introduction of the third impurity I3 into the bottom portion of the trench T1 is an implantation aligned with the side wall of the trench T1.

Figure 5F:
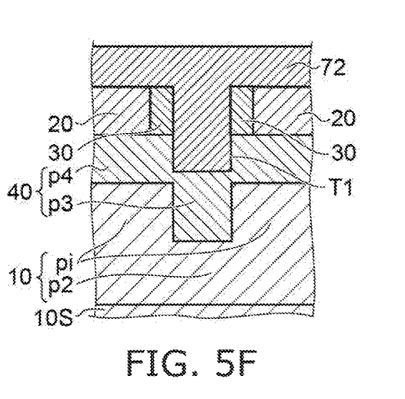

An electrode (the second electrode 72) is formed by introducing a conductive material into the interior of the trench T1 (step S150). For example, the processing illustrated in FIG. 5F is performed.

According to the manufacturing method according to the embodiment, a semiconductor device in which the ON resistance can be reduced can be manufactured efficiently with high precision.

According to the embodiment, a semiconductor device and a method for manufacturing the semiconductor device can be provided in which the ON resistance can be reduced.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor device such as the semiconductor region, the electrode, the insulating film, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various, omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first semiconductor region including a first partial region, a second partial region, and an intermediate partial region positioned between the first partial region and the second partial region, the first semiconductor region being of a first conductivity type;
   a first electrode separated from the first partial region in a first direction, the first direction crossing a direction from the second partial region toward the first partial region;
   a second electrode including
      a first conductive region separated from the second partial region in the first direction, and
      a second conductive region separated from the intermediate partial region in the first direction;

a second semiconductor region provided between the intermediate partial region and a portion of the second conductive region in the first direction, provided between the first conductive region and the first electrode in a second direction, and electrically connected to the second electrode, the second semiconductor region being of the first conductivity type, the second direction crossing the first direction;

a third semiconductor region provided between the intermediate partial region and another portion of the second conductive region in the first direction, provided between the first conductive region and at least a portion of the second semiconductor region in the second direction, and electrically connected to the second electrode, the third semiconductor region being of a second conductivity type;

a fourth semiconductor region including a third partial region and a fourth partial region and being of the second conductivity type, the third partial region being provided between the second partial region and the first conductive region in the first direction, the fourth partial region being provided between the intermediate partial region and the second semiconductor region in the first direction and between the intermediate partial region and the third semiconductor region in the first direction, the fourth partial region being positioned between the first conductive region and the first electrode in the second direction, the fourth partial region being continuous with the third partial region; and a first insulating film provided between the first partial region and the first electrode in the first direction, between the fourth partial region and the first electrode in the second direction, and between the second semiconductor region and the first electrode in the second direction, wherein a first distance along the second direction between the first insulating film and a boundary between the third partial region and the intermediate partial region is longer than a second distance along the second direction between the first insulating film and a boundary between the second semiconductor region and the third semiconductor region.

2. The device according to claim 1, wherein
the first conductive region has a side surface crossing the second direction, and
a boundary between the third partial region and the intermediate partial region is aligned with a plane including the side surface.

3. The device according to claim 1, wherein
the first conductive region has a side surface crossing the second direction, and
a boundary between the third partial region and the intermediate partial region is on an extension of the side surface.

4. The device according to claim 1, wherein the first distance is shorter than a third distance along the second direction between the first conductive region and the first insulating film.

5. The device according to claim 1, wherein at least a portion of the third partial region overlaps the fourth partial region in the second direction.

6. The device according to claim 1, wherein a portion of the second semiconductor region is between the third semiconductor region and the second conductive region in the first direction.

7. The device according to claim 1, wherein the first semiconductor region, the second semiconductor region, the third semiconductor region, and the fourth semiconductor region include silicon carbide.

8. The device according to claim 1, wherein a carrier concentration of the second conductivity type in the fourth partial region is lower than a carrier concentration of the second conductivity type in the third partial region.

9. The device according to claim 1, wherein a density of defects in the third semiconductor region is higher than a density of defects in the fourth partial region.

10. The device according to claim 1, further comprising a second insulating film,
at least a portion of the second insulating film being positioned between the first electrode and a portion of the second electrode in the first direction.

11. The device according to claim 10, wherein a portion of the second insulating film is positioned between the second conductive region and the second semiconductor region in the first direction.

12. The device according to claim 1, further comprising a fifth semiconductor region of the second conductivity type,
the first semiconductor region being provided between the fifth semiconductor region and the fourth semiconductor region in the first direction and between the fifth semiconductor region and the first electrode in the first direction.

13. The device according to claim 1, further comprising a third electrode electrically connected to the first semiconductor region.

14. The device according to claim 13, wherein
the first partial region is provided between the first electrode and the third electrode in the first direction, and
the second partial region is provided between the third partial region and the third electrode in the first direction.

15. The device according to claim 1, wherein the third semiconductor region contacts the first conductive region.

16. The device according to claim 1, wherein the second semiconductor region contacts the second conductive region.

17. A semiconductor device, comprising:
a first semiconductor region including a first partial region, a second partial region, and an intermediate partial region positioned between the first partial region and the second partial region, the first semiconductor region being of a first conductivity type;
a first electrode separated from the first partial region in a first direction, the first direction crossing a direction from the second partial region toward the first partial region;
a second electrode including
a first conductive region separated from the second partial region in the first direction, and
a second conductive region separated from the intermediate partial region in the first direction;
a second semiconductor region provided between the intermediate partial region and a portion of the second conductive region in the first direction, provided between the first conductive region and the first electrode in a second direction, and electrically connected to the second electrode, the second semiconductor region being of the first conductivity type, the second direction crossing the first direction;
a third semiconductor region provided between the intermediate partial region and another portion of the second conductive region in the first direction, provided between the first conductive region and at least a portion of the second semiconductor region in the second direction, and electrically connected to the second electrode, the third semiconductor region being of a second conductivity type;

a fourth semiconductor region including a third partial region and a fourth partial region and being of the second conductivity type, the third partial region being provided between the second partial region and the first conductive region in the first direction, the fourth partial region being provided between the intermediate partial region and the second semiconductor region in the first direction and between the intermediate partial region and the third semiconductor region in the first direction, the fourth partial region being positioned between the first conductive region and the first electrode in the second direction, the fourth partial region being continuous with the third partial region; and a first insulating film provided between the first partial region and the first electrode in the first direction, between the fourth partial region and the first electrode in the second direction, and between the second semiconductor region and the first electrode in the second direction, wherein a length along the second direction of the third semiconductor region is shorter than a length along the first direction of the third semiconductor region.

18. A semiconductor device, comprising:

a first semiconductor region including a first partial region, a second partial region, and an intermediate partial region positioned between the first partial region and the second partial region, the first semiconductor region being of a first conductivity type;

a first electrode separated from the first partial region in a first direction, the first direction crossing a direction from the second partial region toward the first partial region;

a second electrode including
a first conductive region separated from the second partial region in the first direction, and
a second conductive region separated from the intermediate partial region in the first direction;

a second semiconductor region provided between the intermediate partial region and a portion of the second conductive region in the first direction, provided between the first conductive region and the first electrode in a second direction, and electrically connected to the second electrode, the second semiconductor region being of the first conductivity type, the second direction crossing the first direction;

a third semiconductor region provided between the intermediate partial region and another portion of the second conductive region in the first direction, provided between the first conductive region and at least a portion of the second semiconductor region in the second direction, and electrically connected to the second electrode, the third semiconductor region being of a second conductivity type;

a fourth semiconductor region including a third partial region and a fourth partial region and being of the second conductivity type, the third partial region being provided between the second partial region and the first conductive region in the first direction, the fourth partial region being provided between the intermediate partial region and the second semiconductor region in the first direction and between the intermediate partial region and the third semiconductor region in the first direction, the fourth partial region being positioned between the first conductive region and the first electrode in the second direction, the fourth partial region being continuous with the third partial region; and a first insulating film provided between the first partial region and the first electrode in the first direction, between the fourth partial region and the first electrode in the second direction, and between the second semiconductor region and the first electrode in the second direction, wherein a first ratio of a maximum value of an intensity of a photoluminescence of the third semiconductor region in a range of wavelengths not less than 480 nm and not more than 500 nm to a maximum value of an intensity of the photoluminescence of the third semiconductor region in a range of wavelengths not less than 370 nm and not more than 400 nm is higher than a second ratio of a maximum value of an intensity of a photoluminescence of the fourth semiconductor region in a range of wavelengths not less than 480 nm and not more than 500 nm to a maximum value of an intensity of the photoluminescence of the fourth semiconductor region in a range of wavelengths not less than 370 nm and not more than 400 nm.

19. A semiconductor device, comprising:

a first semiconductor region including a first partial region, a second partial region, and an intermediate partial region positioned between the first partial region and the second partial region, the first semiconductor region being of a first conductivity type;

a first electrode separated from the first partial region in a first direction, the first direction crossing a direction from the second partial region toward the first partial region;

a second electrode including
a first conductive region separated from the second partial region in the first direction, and
a second conductive region separated from the intermediate partial region in the first direction;

a second semiconductor region provided between the intermediate partial region and a portion of the second conductive region in the first direction, provided between the first conductive region and the first electrode in a second direction, and electrically connected to the second electrode, the second semiconductor region being of the first conductivity type, the second direction crossing the first direction;

a third semiconductor region provided between the intermediate partial region and another portion of the second conductive region in the first direction, provided between the first conductive region and at least a portion of the second semiconductor region in the second direction, and electrically connected to the second electrode, the third semiconductor region being of a second conductivity type;

a fourth semiconductor region including a third partial region and a fourth partial region and being of the second conductivity type, the third partial region being provided between the second partial region and the first conductive region in the first direction, the fourth partial region being provided between the intermediate partial region and the second semiconductor region in the first direction and between the intermediate partial region and the third semiconductor region in the first direction, the fourth partial region being positioned between the first conductive region and the first electrode in the second direction, the fourth partial region being continuous with the third partial region; and a first insulating film provided between the first partial region and the first electrode in the first direction, between the fourth partial region and the first electrode in the second direction, and between the second semiconductor region and the first electrode in the second direction, the second semiconductor region not contacting the second conductive region in the second direction.

* * * * *